United States Patent [19]

LeTourneau

[11] 4,179,008

[45] Dec. 18, 1979

[54] STRUCTURE AND ARRANGEMENT FOR LOUDSPEAKER ASSEMBLAGE

[76] Inventor: Ted L. LeTourneau, P.O. Box 7655, Longview, Tex. 75602

[21] Appl. No.: 899,324

[22] Filed: Apr. 24, 1978

[51] Int. Cl.$^2$ .......................... H05K 5/00; A47B 81/06

[52] U.S. Cl. .................................... 181/147; 181/145; 181/148; 181/153; 181/199

[58] Field of Search ............... 181/147, 148, 145, 144, 181/153, 154, 151, 199, 143

[56] References Cited

U.S. PATENT DOCUMENTS

| | | | |
|---|---|---|---|
| 3,054,856 | 9/1962 | Arany | 181/147 |
| 3,157,247 | 11/1964 | Oshimura | 181/143 |
| 3,888,333 | 6/1975 | Yamaguchi | 181/143 |
| 3,931,867 | 1/1976 | Janszen | 181/153 |
| 4,057,689 | 11/1977 | Stallings, Jr. | 181/145 |

*Primary Examiner*—Stephen J. Tomsky
*Attorney, Agent, or Firm*—Wm. T. Wofford

[57] ABSTRACT

A loudspeaker assemblage is made up of a group of cylindrical speaker housings, with a speaker mounted in each housing. A respective spacer in the form of a wedge block or angle sleeve is interposed between adjacent housings, so that housing end closures abut respective wedges. A flexible tension member passes through each speaker housing and spacer so that when the tension member is taut, the housings and spacers are clamped to make up a relatively rigid structure having a generally toroidal shape. The tension member is releasable so that the speaker housings can be rotated about a respective axis normal to the speaker axis to selectively orient the speakers. When the tension member is taut, the speakers are retained in the selected orientation.

9 Claims, 6 Drawing Figures

Fig. 1
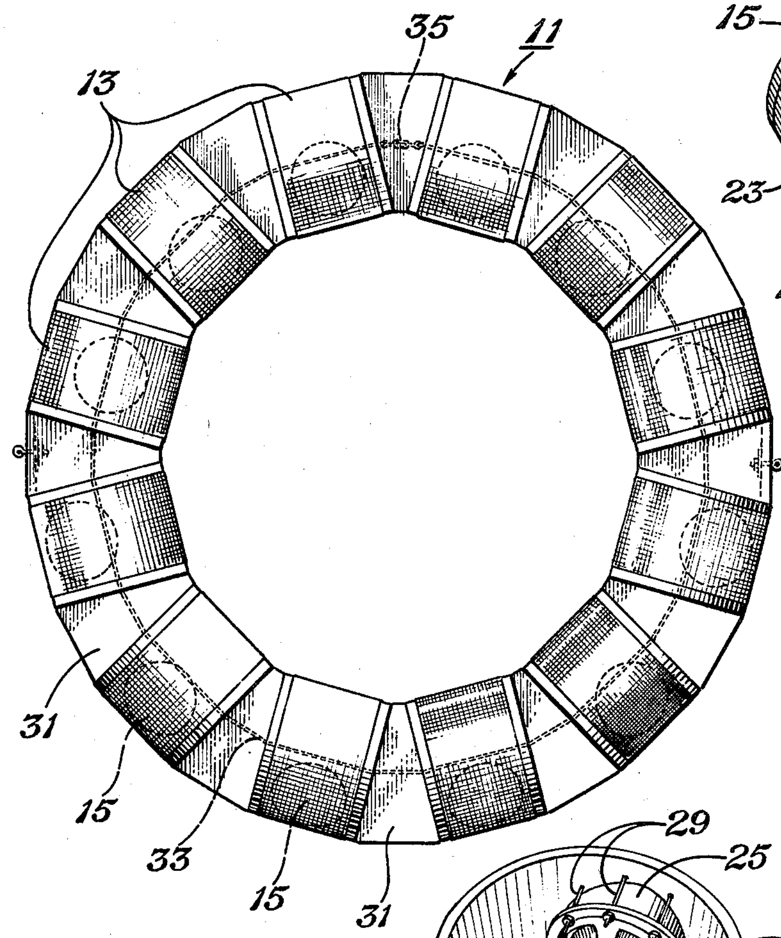
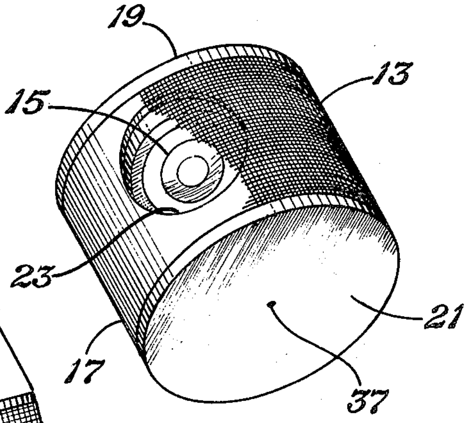
Fig. 2
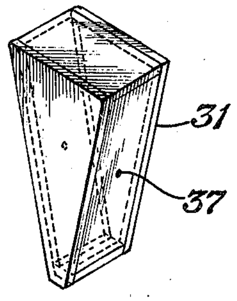
Fig. 3
Fig. 4
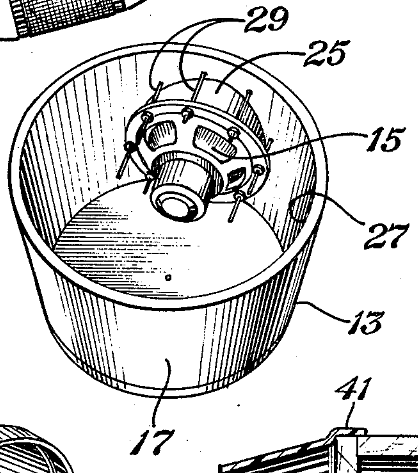
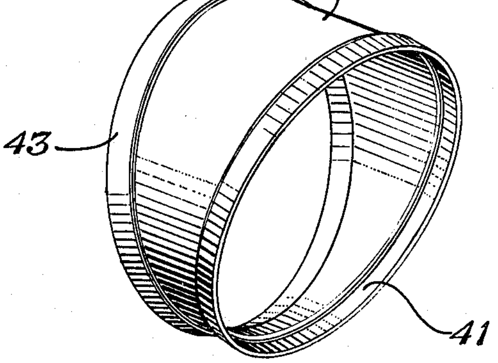
Fig. 5
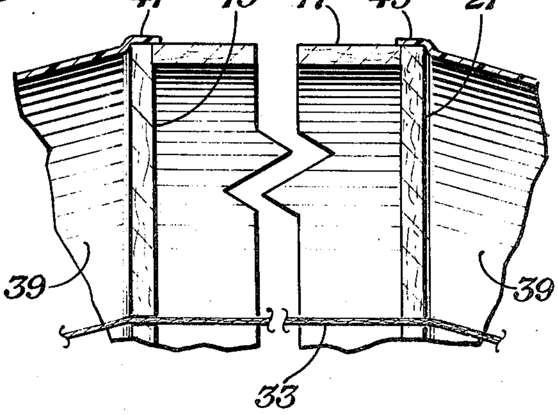
Fig. 6

STRUCTURE AND ARRANGEMENT FOR LOUDSPEAKER ASSEMBLAGE

FIELD OF THE INVENTION

The present invention relates to loudspeakers, and more particularly to improved structure and arrangement for a loudspeaker assemblage.

BACKGROUND OF THE INVENTION

In providing the loudspeaker arrangement for the sound system for an auditorium, hall, church, or the like, where several hundred people may be present to hear both speech and music, there is a wide choice of design available in the prior art. The designer must choose speaker types and sizes; the number of speakers to be used; the type and size of speaker assemblies; and their location and orientation. It is always possible to design a good system where economy is not emphasized. It is a worthy objective to design a system which will perform effectively at the lowest possible cost.

The object of the present invention is tc provide an improved structure and arrangement for a loudspeaker assemblage, which assemblage may be the primary speaker component of a sound system for a hall, auditorium, church, or the like, where several hundred people may be assembled, and which assemblage will contribute significantly to both the effectiveness and economy of the sound system.

For a further understanding of the invention and further objects, features, and advantages thereof, reference may now be had to the following description taken in conjunction with the accompanying drawing.

BRIEF DESCRIPTION OF THE DRAWING

FIG. 1 is a schematic elevational view showing a loudspeaker assemblage in accordance with a preferred embodiment of the invention.

FIG. 2 is a schematic perspective view showing a single speaker assembly of the type utilized by the assemblage of FIG. 1.

FIG. 3 is a schematic perspective view showing a single wedge shaped spacer block of the type utilized by the assemblage of FIG. 1.

FIG. 4 is a schematic perspective view of the speaker assembly of FIG. 2 with an end closure removed.

FIG. 5 is a schematic perspective view of an angle sleeve spacer that may be used in an alternate embodiment of the invention.

FIG. 6 is a schematic fragmentary view showing angle sleeve type spacers fitted onto the end closures of a speaker assembly like that of FIG. 2.

SUMMARY OF THE INVENTION

In accordance with the present invention, there is provided a loudspeaker assemblage made up of a group of speakers, with mounting means providing for adjustment of each speaker about a respective rotational axis which is normal to and intersects the central axis of the respective speaker, to a selected position and retaining the speaker at the selected position. The mounting means further provides for disposing the speakers with the points of intersection of the respective central and rotational axes lying substantially on a circle and in a common plane.

In accordance with one aspect of the invention, the mounting means includes a housing for each speaker and a respective spacer disposed between each adjacent pair of speaker housings; with each speaker being fixed relative to its housing and with each housing being rotatably adjustable relative to adjacent spacers.

The spacers, in accordance with one embodiment of the invention, may be a wedge shaped block which is preferably a hollow box. In accordance with another embodiment of the invention, the spacers may be angle sleeves having end flanges for receiving ends of respective speaker housings.

The speaker housings are peferably a cylindrical shape; the housing cylindrical portion preferably is made of laminated fibreboard; and each housing preferably forms a closed baffle for its speaker.

In accordance with another aspect of the invention, a flexible tension member passes through each speaker housing and spacer to releasably clamp the housings and spacers.

DESCRIPTION OF PREFERRED EMBODIMENTS

Referring now to the drawing, in FIG. 1 there is shown a loudspeaker assemblage 11 made up of a group of loudspeaker assemblies 13. Each loudspeaker assembly 13, as best shown by FIGS. 2 and 4, has a single speaker 15 mounted in a cylindrical housing. The cylindrical housing has a cylindrical body portion 17 and end closures 19, 21. The cylindrical body portion has a circular opening 23 for the speaker. A filler element 25 has a front face shaped so as to contiguously about the cylindrical body portion inner surface 27 about the periphery of the opening 23, and has a planar rear face which abuts the speaker mounting periphery. The speaker 15 and the filler element 25 are held in place by bolts 29 which clamp the filler element between the speaker and the housing inner surface.

As seen in FIG. 1, the loudspeaker assembly group is made up of twelve loudspeaker assemblies 13. A respective spacer 31 in the form of a wedge shaped block is interposed between each pair of adjacent speaker assemblies 13. The wedge shaped block is a hollow box-like structure, as best seen in FIG. 3.

A flexible tension member 33, preferably a wire or cable, terminates at its ends in a turnbuckle 35. The tension member 33 passes through centrally disposed holes 37 in the spacer 31 and the speaker assembly end closures 19, 21, so that when the turnbuckle 35 is adjusted so that the tension member 33 is taut, the speaker assemblies 13 and spacers 31 are clamped to make up a relatively rigid structure which has a generally toroidal shape. The turnbuckle 35 can be loosened to reduce the tension member tautness so that the speaker assemblies can be rotated to give each speaker a selected orientation. Then, the turnbuckle 35 can be tightened so that the speaker assemblies are retained in the selected speaker orientation positions. It may be observed that each speaker 15 is rotatable (for speaker orientation adjustment) about a rotational axis (not shown) that is normal to the speaker central axis (not shown). Thus, when the tension member is taut, the points of intersection of the respective speaker central axis and rotational axis will lie substantially on a circle and in a common plane.

In accordance with an alternate embodiment, the spacers may have the form of an angle sleeve 39, as best shown by FIGS. 5 and 6. The angle sleeve 39 has end flanges 41, 43 which are sized to receive the end portions of adjacent speaker assemblies.

The number of speaker assemblies in a speaker assemblage of the present invention; their dimensions and speaker size, will vary in accordance with the requirements of the sound system in which the assemblage will be applied. In the embodiment shown, which can be considered as typical, twelve speaker assemblies are used. The speaker housings have a diameter of about 12 inches and a length of about 10 inches. The material for the housing cylindrical portion 17 and the filler element 25 is preferably ¼ inch thick laminated fibreboard stock of a type that is readily available and is commonly used for concrete forms, carpet centers, container bodies and the like. The speaker size is 8 inches. The material for the wedge shaped block 31 may be wood, metal or plastic, but is preferably plywood, and the block is preferably hollow. The angle sleeve form of spacer is preferably molded plastic. The spacer which is at the location of turnbuckle 35 will, of course, need an access opening (not shown).

The loudspeaker assemblage can be retained in a desired location by any suitable means, but is preferably hung and suspended by means of a flexible wire or cable which has its ends fixed to oppositely disposed spacers. In FIG. 1, there are shown eye-bolts 45 for this purpose.

It will be apparent from the foregoing that a loudspeaker assemblage as herein disclosed can function effectively as the primary speaker component of a sound system for a hall, auditorium, church or the like, where several hundred people may be assembled, and the assemblage will contribute significantly to both the effectiveness and the economy of the sound system. In a typical installation, the assemblage may be hung at the upper center portion of the end of the hall or the like which the audience will face.

The foregoing disclosure and the showings made in the drawings are merely illustrative of the principles of this invention and are not to be interpreted in a limiting sense.

What is claimed is:

1. A loudspeaker assemblage comprising:

a. a group of speakers, with each speaker having a central axis;

b. support means for each said speaker, with each said speaker being fixed to a respective said support means;

c. means interconnecting all said support means to form an annular structure having a central axis and providing individual adjustment of said speakers to respective selected positions relative to a respective rotational axis which intersects and is normal to the respective said speaker central axis and also is normal to a radial plane of said annular structure that bisects said respective speaker and contains the speaker central axis, and with each said speaker facing away from a common side of the central plane of said annular structure.

2. The device of claim 1 wherein said support means for each speaker comprises a housing and said interconnecting means includes a respective spacer disposed between each adjacent pair of speaker housings; each said speaker being fixed relative to its housing and each said housing being rotatably adjustable relative to adjacent spacers.

3. The device of claim 2 wherein each said housing has a cylindrical shape and each said spacer is a wedge shaped block with an end surface of each housing abutting a side surface of each adjacent spacer.

4. The device of claim 3 wherein a flexible tension member passes through each said housing and each said spacer to releasably clamp said housings and spacers.

5. The device of claim 2 wherein each said housing has a cylindrical shape and each said spacer is an angle sleeve having end flanges sized to receive ends of respective adjacent cylindrical housings.

6. The device of claim 4 wherein the cylindrical portion of each said housing is made of laminated fibreboard.

7. The device of claim 5 wherein the cylindrical portion of each said housing is made of laminated fibreboard.

8. The device of claim 6 wherein said housing forms an effectively closed baffle for its speaker.

9. The device of claim 7 wherein said housing forms an effectively closed baffle for its speaker.

* * * * *